United States Patent
Breuil et al.

(10) Patent No.: US 8,377,791 B2
(45) Date of Patent: Feb. 19, 2013

(54) NONVOLATILE MEMORY ELEMENT AND PRODUCTION METHOD THEREOF AND STORAGE MEMORY ARRANGEMENT

(75) Inventors: Laurent Breuil, Leuven (BE); Franz Schuler, Dresden (DE); Georg Tempel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/043,129

(22) Filed: Mar. 8, 2011

(65) Prior Publication Data

US 2011/0159661 A1 Jun. 30, 2011

Related U.S. Application Data

(62) Division of application No. 12/040,489, filed on Feb. 29, 2008, now Pat. No. 7,923,342, which is a division of application No. 10/522,386, filed as application No. PCT/DE03/02434 on Jul. 19, 2003, now Pat. No. 7,361,924.

(30) Foreign Application Priority Data

Jul. 26, 2002 (DE) .................... 102 34 660

(51) Int. Cl.
*H01L 21/20* (2006.01)

(52) U.S. Cl. ............ 438/382; 438/84; 438/95; 438/102; 257/E21.004; 257/E21.068

(58) Field of Classification Search ............... 438/382, 438/84, 95, 102; 257/E21.004, E21.068
See application file for complete search history.

(56) References Cited

U.S. PATENT DOCUMENTS

| | | | |
|---|---|---|---|
| 6,545,903 B1 | 4/2003 | Wu | 365/148 |
| 2001/0002046 A1* | 5/2001 | Reinberg et al. | 257/3 |
| 2002/0168852 A1 | 11/2002 | Harshfield et al. | 438/650 |
| 2003/0036232 A1* | 2/2003 | Dennison | 438/257 |
| 2003/0143782 A1* | 7/2003 | Gilton et al. | 438/128 |

* cited by examiner

Primary Examiner — Julia Slutsker

(57) ABSTRACT

A nonvolatile memory element and associated production methods and memory element arrangements are presented. The nonvolatile memory element has a changeover material and a first and second electrically conductive electrode present at the changeover material. To reduce a forming voltage, a first electrode has a field amplifier structure for amplifying a field strength of an electric field generated by a second electrode in a changeover material. The field amplifier structure is a projection of the electrodes which projects into the changeover material. The memory element arrangement has multiple nonvolatile memory elements which are arranged in matrix form and can be addressed via bit lines arranged in column form and word lines arranged in row form.

2 Claims, 11 Drawing Sheets

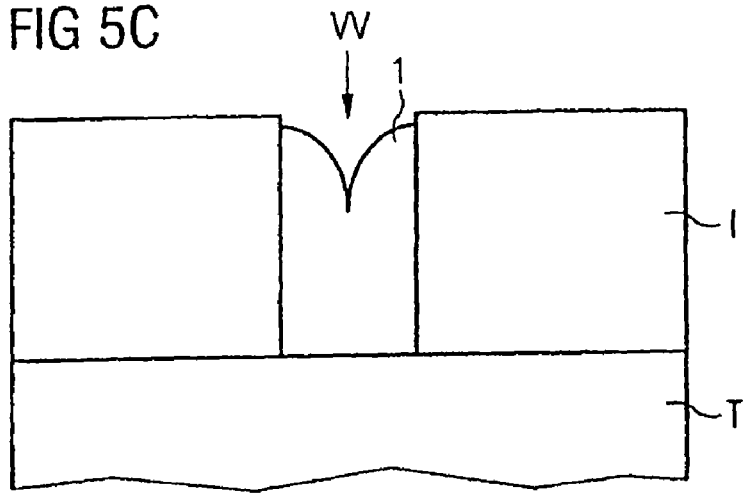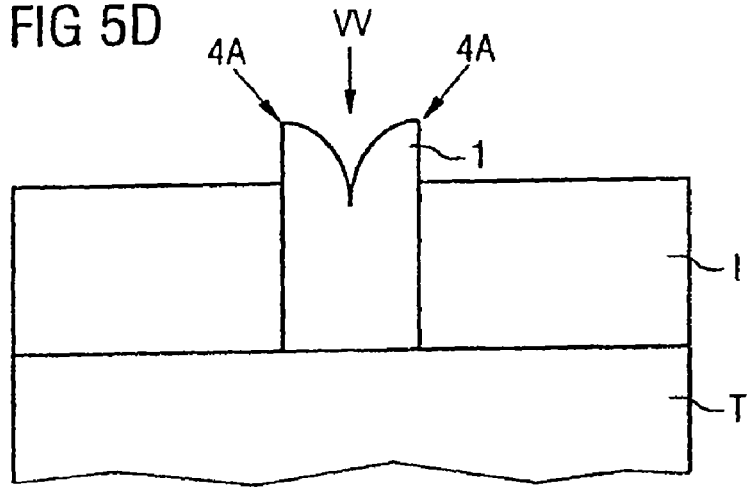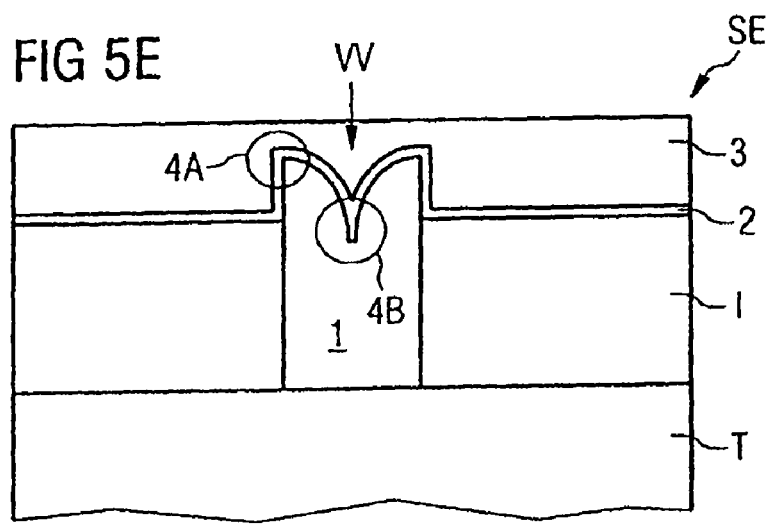

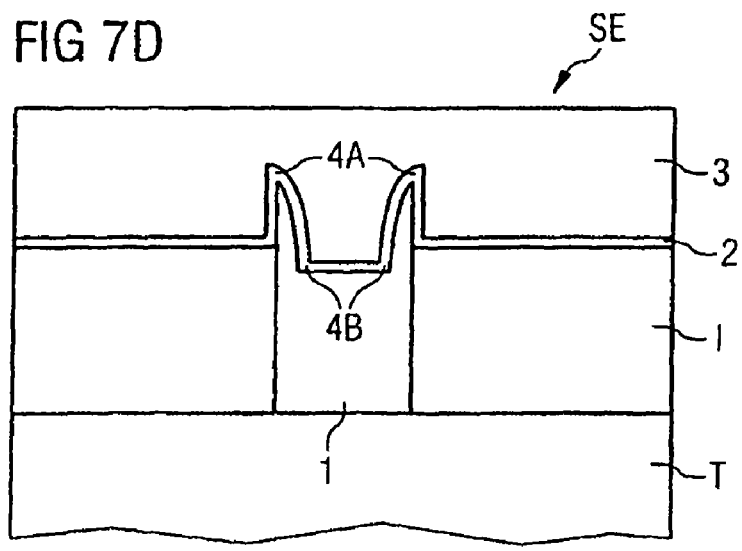
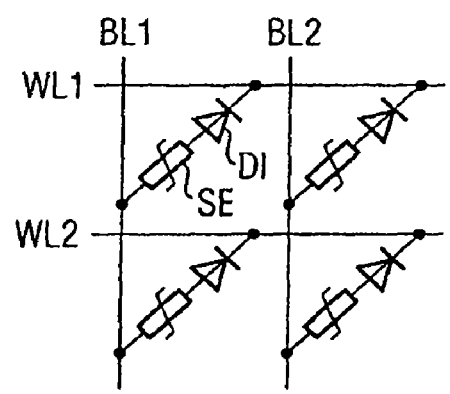
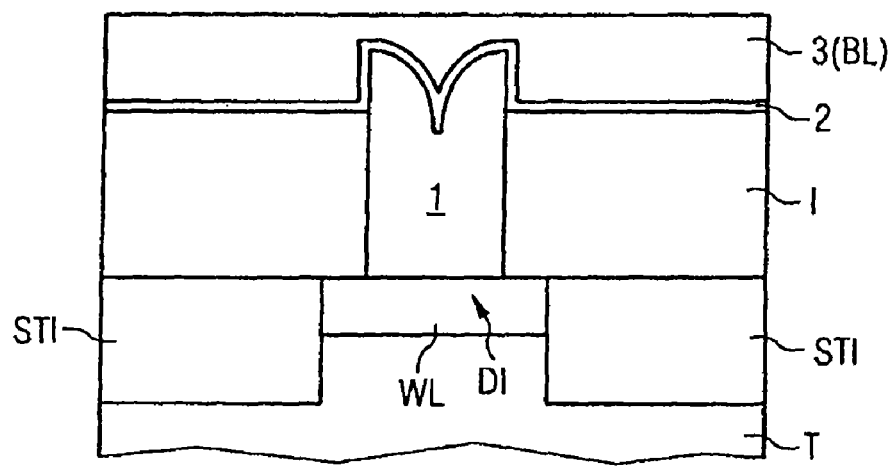

NONVOLATILE MEMORY ELEMENT AND PRODUCTION METHOD THEREOF AND STORAGE MEMORY ARRANGEMENT

PRIORITY CLAIM

This application is a Divisional of, and claims the benefit of priority from, U.S. application Ser. No. 12/040,489, filed Feb. 29, 2008 now U.S. Pat. No. 7,923,342, which is a Divisional of U.S. application Ser. No. 10/522,386, filed Dec. 12, 2005 now U.S. Pat. No. 7,361,924, which is the national stage application of International Application No. PCT/DE2003/002434, filed Jul. 19, 2003, which claims the benefit of priority from German Patent Application No. DE 102 34 660.7, filed Jul. 26, 2002, which are incorporated herein by reference.

BACKGROUND OF THE INVENTION

1. Technical Field

The present invention relates to a nonvolatile memory element and to associated production methods and memory element arrangements and, in particular, to a nonvolatile memory element having a changeover material in which, after a forming step, at least two different conductivity states are realized and changeover between the conductivity states can be effected once or a number of times by the application of predetermined programming voltages.

2. Related Art

FIGS. 1A to 1C show a simplified sectional view and simplified U-I characteristic curves of a nonvolatile memory element of the generic type, as is disclosed in the document U.S. Pat. No. 5,360,981, for example.

In accordance with FIG. 1A, such a nonvolatile memory element has a first electrode 1, a changeover material 2 formed thereon and a second electrode 3, the electrodes 1 and 3 being correspondingly connected up for the application of a voltage and for the generation of an electric field E. The changeover material 2 comprises, for example, a hydrogen-saturated amorphous silicon semiconductor material (hydrogenated amorphous silicon) which has a p-type doping. By way of example, an electrically conductive material, and preferably Cr, is used for the first electrode 1. Suitable selection for the second electrode 3 results in either an analog changeover behavior for the changeover material 2 or digital changeover behavior. In accordance with FIG. 1A, by way of example, an analog changeover behavior is obtained with the use of V, Co, Ni and Tb, while a digital changeover behavior can be realized for the materials Cr, W, or Ag as second electrode 3.

What is characteristic of such nonvolatile memory elements is, in particular, a necessary forming step which is carried out at the outset and enables the actual nonvolatile memory properties of the memory element in the first place.

In accordance with FIG. 1B, by way of example, a linear U-I characteristic curve initially present is converted into a memory characteristic curve range in accordance with FIG. 1C only by the application of a forming voltage $F_A$. Such forming voltages $F_A$ are relatively high voltages and usually lie in a range of 5 to 30 volts, in accordance with FIG. 1B a forming step being carried out at a forming voltage $F_A = -20$ V.

Accordingly, it is only after this forming step has been carried out or after the application of this forming voltage $F_A$ in the changeover material 2 that a family $K_A$ of characteristic curves is generated which has nonvolatile memory properties and, by way of example, the two conductivity states or characteristic curve branches ON and OFF illustrated in FIG. 1C.

In the case of the family $K_A$ of characteristic curves illustrated in FIG. 1C, Cr was used as electrode material and hydrogen-saturated amorphous silicon with a p-type doping was used as changeover material 2.

On the basis of this complex family $K_A$ of characteristic curves obtained after the forming step in accordance with FIG. 1C, it is then possible to realize an actual nonvolatile memory behavior, the conductivity states ON and OFF being traversed in the arrow direction by the application of corresponding operating voltages.

More precisely, by way of example, a changeover material 2 having the conductivity state ON can be reprogrammed by application of a programming voltage $V_{erase}$ of approximately 2.5 volts, as a result of which the conductivity state or characteristic curve branch ON switches to the further conductivity state or characteristic curve branch OFF. In the same way, the conductivity state ON can be generated again in the changeover material 2 by the application of a further programming voltage $V_{write}$ of $-3$ V, for example. In this way, it is possible to switch back and forth between the two conductivity states ON and OFF in the family $K_A$ of characteristic curves or to effect programming, respective read voltages $V_{read}$ being below the programming voltages and, in accordance with FIG. 1C, having 1 volt, by way of example. Since the family $K_A$ of characteristic curves or the conductivity states ON and OFF once programmed do not change in such changeover materials 2, a nonvolatile memory element is thus obtained with evaluation of an associated read current.

FIG. 2A shows a simplified sectional view of a further conventional nonvolatile memory element, in which case, however, the changeover material comprises a multilayer sequence. More precisely, by way of example, a p-doped hydrogen-saturated amorphous silicon 2A is formed on a first electrode 1, the surface of said silicon being adjoined by an n-doped hydrogen-saturated amorphous silicon layer 2B. Toward the second electrode 3, the changeover material 2 furthermore has an undoped, once again hydrogen-saturated amorphous silicon, as a result of which a so-called p-n-i structure is obtained. Although nonvolatile memory elements of this type have the advantage that the electrode materials are less critical in particular for p-doped semiconductor materials, the voltages for the necessary forming step are nevertheless even higher than in the case of the changeover material in accordance with FIG. 1A, which is why they have not been taken into consideration heretofore for mass production of nonvolatile memories.

FIG. 2B shows a simplified family $K_A$ of characteristic curves once again after a forming step has been carried out, resulting in an improved programming on account of the higher distance between the different conductivity states ON and OFF.

Therefore, the invention is based on the object of providing a nonvolatile memory element and associated production methods and memory element arrangements which can be used to realize an integration into conventional semiconductor circuits. In particular, the invention is based on the object of optimizing the forming step necessary for forming the nonvolatile memory behavior.

SUMMARY

According to the invention, this object is achieved by means of the features of patent claim 1 with regard to the nonvolatile memory element. This object is achieved by means of the measures of patent claim 8 with regard to the method, and this object is achieved by means of the features of patent claims 22 to 24 with regard to the memory element arrangements.

In particular through the use of at least one field amplifier structure at least one of the electrodes for amplifying a field strength of the electric field in the changeover material, the voltages which are necessary for the forming step—but which are very high—can be significantly reduced, as a result of which these memory elements can for the first time be linked or combined with conventional semiconductor circuits such as e.g. CMOS circuits.

The field amplifier structure preferably constitutes a projection of the electrodes which projects into the changeover material, such as e.g. a tip, a corner or edge, an angle preferably being ≦90 degrees. In this way, required field peaks or field increases can be formed in a particularly simple manner in integrated nonvolatile memory elements.

The changeover material preferably comprises a hydrogen-saturated amorphous semiconductor material, it also being possible to use multilayer structures, and the electrodes preferably comprise metallic materials.

With regard to the method for producing a nonvolatile memory element, in particular a depression is formed in an auxiliary layer and, in order to form the first electrode, said depression is filled with a first electrically conductive material, as a result of which the field amplifier structure can be formed in a particularly simple manner in subsequent steps.

In this case, the electrically conductive material is preferably deposited in such a way that an adapted depression is produced in the region of the depression, the electrically conductive material being etched back conformally at least as far as the surface of the auxiliary layer by means of an anisotropic etching method and the auxiliary layer being etched back essentially as far as the bottom region of the adapted depression by means of an anisotropic etching method. In this way, sharp tips are formed at the first electrode, which lead to the desired field increase and thus to the reduction of the forming voltage.

As an alternative, however, it is also possible for the electrically conductive material to be caused to recede at least as far as the surface of the auxiliary layer by means of a polishing method and for the auxiliary layer to be etched back by a predetermined amount by means of a subsequent selective etching method, as a result of which very sharp edges or corners are again obtained at the first electrode, which lead to the desired field amplification or field increase.

In accordance with a further alternative, at least a predetermined amount of the electrically conductive material may be removed in the depression by means of an etching method, a thin conformal electrically conductive layer may subsequently be formed in such a way that an adapted depression is produced in the region of the depression and, finally, the electrically conductive layer is etched back at least as far as the surface of the auxiliary layer by means of an anisotropic etching method or by means of a spacer method. After a further etching-back step by means of an anisotropic etching method of the auxiliary layer essentially as far as the bottom region of the adapted depression, once again a field amplifier structure or field elevation caused by the spacer structure is obtained in the electric field of the changeover material, as a result of which the required forming voltages can be significantly reduced.

With regard to the memory element arrangement, the nonvolatile memory elements are arranged in matrix form and addressed via bit lines arranged in column form and word lines arranged in row form, in which case a respective first electrode of the memory element is electrically connected directly via an ohmic junction or a diode junction to a respective word line formed in a semiconductor substrate and a respective second electrode for forming a respective bit line is patterned in strip form at the surface of the semiconductor substrate.

As an alternative, however, in a memory element arrangement, there may be formed for each nonvolatile memory element a selection transistor with a word line serving as control layer and a bit line serving as first source/drain region in the semiconductor substrate, in which case a second source/drain region of the selection transistor is electrically connected to a respective first electrode of the memory element.

A novel and highly integrated nonvolatile memory element arrangement is likewise obtained as a result. The invention is described in more detail below using exemplary embodiments with reference to the drawing.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIGS. 5A to 5E show simplified sectional views for illustrating essential method steps in the production of a nonvolatile memory element in accordance with a third exemplary embodiment;

FIGS. 7A to 7D show simplified sectional views for illustrating essential method steps in the production of a nonvolatile memory element in accordance with a fifth exemplary embodiment;

FIGS. 8A and 8B show a simplified equivalent circuit diagram of a memory element arrangement and a simplified sectional view of an associated nonvolatile memory element in accordance with a sixth exemplary embodiment;

DETAILED DESCRIPTION OF THE PREFERRED EMBODIMENTS

Figure 1A:
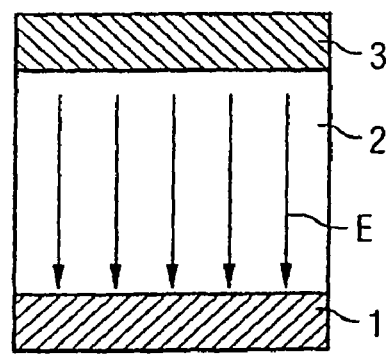
FIGS. 1A to 1C show a simplified sectional view and simplified families of U-I characteristic curves of a nonvolatile memory element in accordance with the prior art.
Figure 1B:
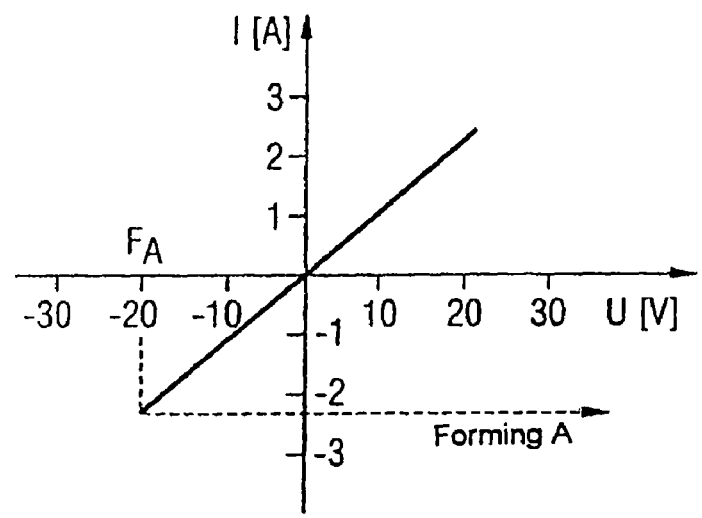
Figure 1C:
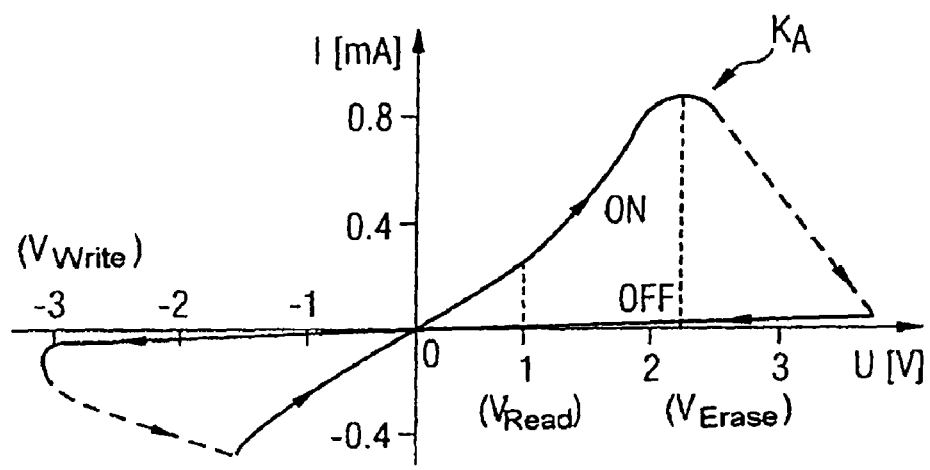
Figure 2A:
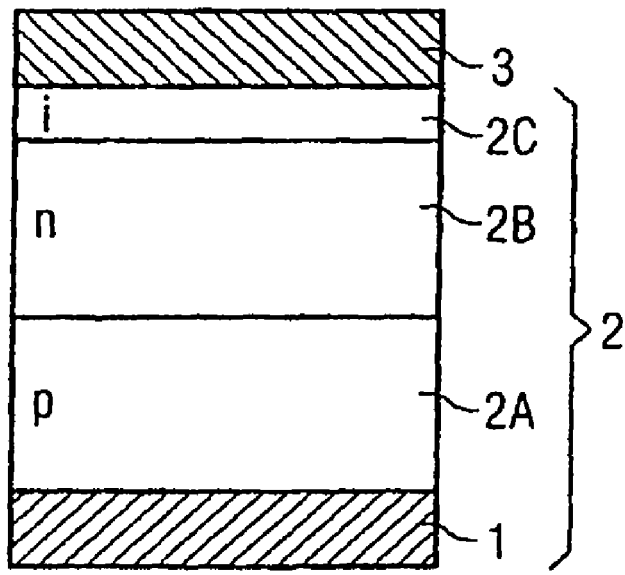
FIGS. 2A and 2B show a simplified sectional view and a simplified family of U-I characteristic curves of a further nonvolatile memory element in accordance with the prior art.
Figure 2B:
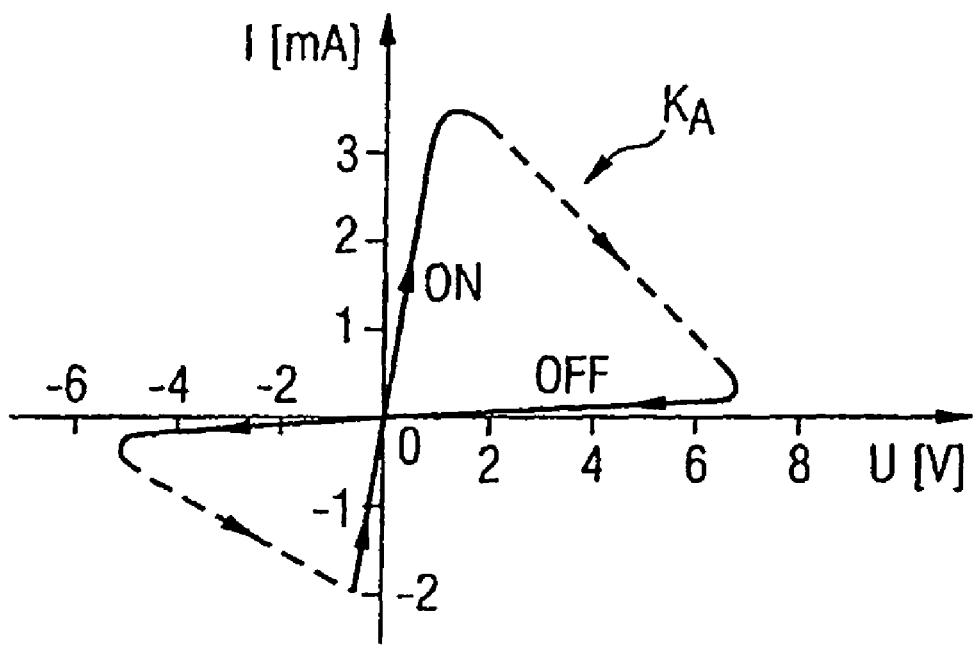

The invention is described below using a simplified nonvolatile memory element on the basis of a memory element in accordance with FIG. 1A, identical reference symbols designating identical or corresponding layers or elements and a repeated description being dispensed with below. In particular, however, it should be pointed out that the changeover material 2 may in the same way also have a multilayer construction, in particular amorphous semiconductor materials with different doping being taken into account.

First Exemplary Embodiment

Figure 3A:
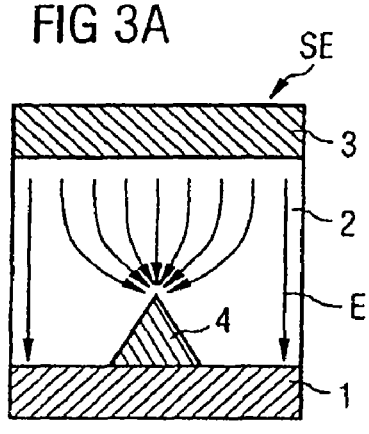
FIGS. 3A to 3C show a simplified sectional view and simplified families of U-I characteristic curves of a nonvolatile memory element in accordance with a first exemplary embodiment.

In accordance with FIG. 3A, the nonvolatile memory element SE in accordance with a first exemplary embodiment once again comprises a changeover material 2 and two electrically conductive electrodes 1 and 3 present at the changeover material 2, to which electrodes an electric voltage can be applied and an electric field E can be generated in the changeover material 2. In this case, the changeover material 2 once again has the special properties wherein at least two different conductivity states prevail after a forming step, between which changeover can be repeatedly effected by the application of predetermined programming voltages.

Hydrogen-saturated amorphous silicon or a corresponding multilayer construction is preferably used as changeover material 2, the amorphous silicon being prepared for example by means of the so-called glow discharge technique. Furthermore, the first electrode 1 and the second electrode 3 comprise a suitable electrically conductive material, which preferably has a metal.

An exemplary list of possible materials for the first and second electrodes 1 and 3 and for the changeover material 2 is specified below, other materials also being conceivable, in principle.

The processes occurring in the changeover material 2 have not been completely clarified heretofore, although it is assumed, particularly when using amorphous silicon, that in the changeover material electrically conductive or metal filaments form within the amorphous material upon the application of a predetermined voltage, which are destroyed upon the application of a reversed voltage and/or a reversed current.

What is essential to the present invention, then, is that at least one of the electrodes 1 or 3 has at least one field amplifier structure 4 for amplifying a field strength of the electric field E in the changeover material 2. Accordingly, in accordance with FIG. 3A, at the first electrode 1 a tip 4 is formed as field amplifier structure, which leads to a significant amplification of the electric field E prevailing in the changeover material 2. This field amplification gives rise to field peaks in the changeover material 2 which have a favorable effect in particular on the forming step mentioned in the introduction.

Figure 3B:
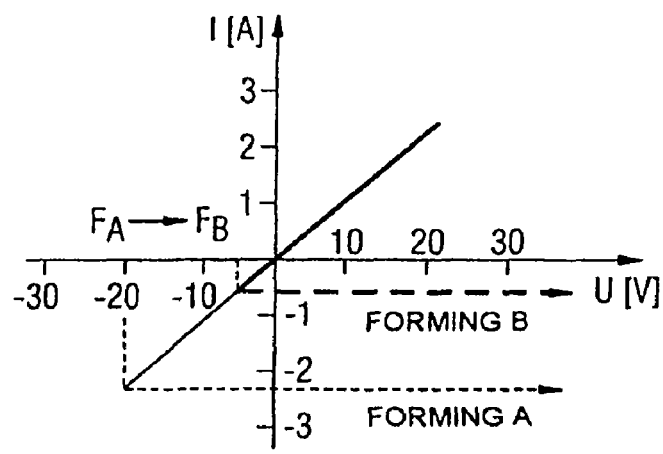

Accordingly, in accordance with FIG. 3B, in the case of a nonvolatile memory element SE with the field amplifier structure 4 illustrated in FIG. 3A, the usually required forming voltage $F_A$ of approximately V is shifted to, for example, a reduced forming voltage $F_B$ of −5 V, for example, thus passing into a voltage range as is available for example in conventional CMOs semiconductor circuits—More precisely, the field amplifier structure 4 formed in the nonvolatile memory element enables this component to be integrated for the first time with conventional semiconductor components which operate in a voltage range of below 10 volts, and preferably below 5 volts. Drive circuits for the required operating voltages can thus be simplified and a power consumption can thereby be significantly reduced.

Figure 3C:
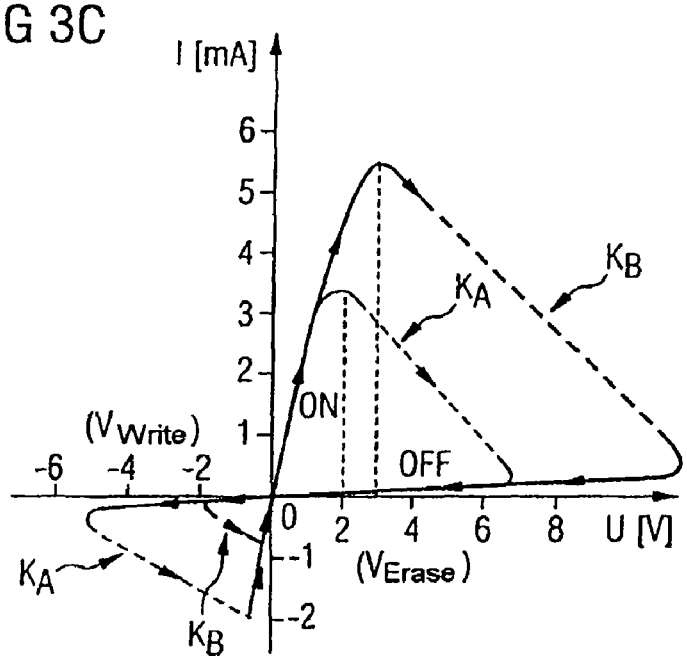

In accordance with FIG. 3C, the nonvolatile memory element SE or the changeover material 2 thereof has a modified family $K_B$ of characteristic curves after the forming step, which now has a significantly lower forming voltage $F_B$. In this case, a family of characteristic curves in accordance with the prior art is likewise represented by $K_A$. Accordingly, with the field amplifier structure 4 formed on the first electrode 1, not only is a forming voltage reduced, but also a family of characteristic curves of the changeover material 2 or of the nonvolatile memory SE is altered. More precisely, on account of the single-sided field amplification, the family of characteristic curves is compressed from $K_A$ to $K_B$ in the negative voltage range, while it is extended in the positive voltage range on account of the opposite sign.

The consequence of this is that not only can the forming voltage be reduced, but also the programming voltages $V_{erase}$ and $V_{write}$ can be adapted to respective boundary conditions.

Second Exemplary Embodiment

Figure 4A:
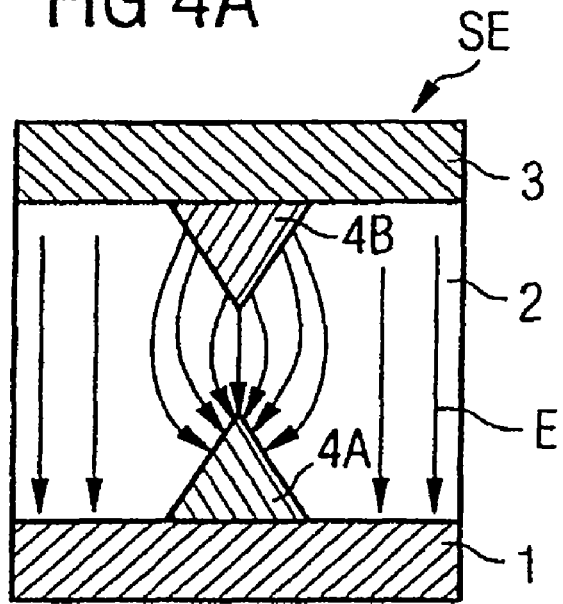
FIGS. 4A and 4B show a simplified sectional view and a simplified family of U-I characteristic curves of a nonvolatile memory element in accordance with a second exemplary embodiment.
Figure 4B:
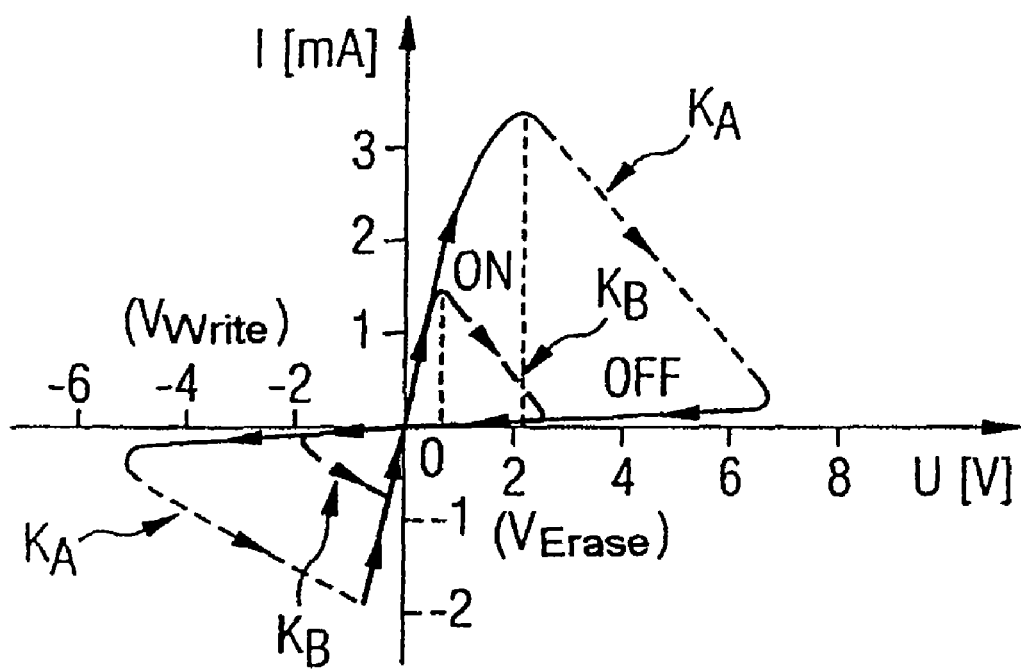

FIGS. 4A and 4B show a simplified sectional view and an associated family of U-I characteristic curves in accordance with a second exemplary embodiment, identical reference symbols designating identical or corresponding elements or layers and a repeated description being dispensed with below.

In accordance with FIG. 4A, now not only is there a tip 4A formed at the first electrode 1, but also a corresponding tip 4B opposite the tip 4A is formed as field amplifier structure at the second electrode 3, as a result of which a field amplification can be generated in both directions, i.e. positive and negative voltage. A reduction of the forming voltage is once again produced by virtue of this field amplifier structure 4A and 4B in the nonvolatile memory element SE, a compression of the families of characteristic curves from $K_A$ to $K_B$ now also being produced in the positive voltage range in accordance with FIG. 4B. Accordingly, it is possible to reduce not only the programming voltages $V_{write}$ for writing or for changing over the conductivity state from OFF to ON, but also the programming voltages $V_{erase}$ for erasing the nonvolatile memory element SE or for changing over from the ON conductivity state to the OFF conductivity state. In addition to the significantly reduced forming voltage FB for producing the nonvolatile memory behavior in the changeover material 2 or nonvolatile memory element SE, an adaptation of the family of characteristic curves and, in particular, a reduction of the required write and erase voltages are obtained by virtue of the field amplifier structure. In this way, it is possible, therefore, to realize totally novel nonvolatile memories with significantly reduced operating voltages and a greatly improved current or power consumption.

In accordance with the first and second exemplary embodiments, a tip was formed at the first electrode 1 and/or the second electrode 3 as field amplifier structure. However, in the same way, other projections of the electrodes 1 and 3 such as e.g. corners or edges formed can also be used as field amplifier structures provided that they project into the changeover material 2 and at least locally amplify a field strength of the electric field E therein. An angle of the tips, corners or edges in the electrodes 1 and 3 preferably has an acute angle, i.e. an angle ≦90 degrees, as a result of which local field peaks can be realized in a particularly simple manner. However, the methods described below, in particular, are appropriate for particularly simple and cost-effective realization.

Third Exemplary Embodiment

FIGS. 5A to 5E show simplified sectional views for illustrating essential method steps in the production of a nonvolatile memory element in accordance with a third exemplary embodiment, identical reference symbols designating identical or corresponding elements or layers and a repeated description being dispensed with below.

Figure 5A:
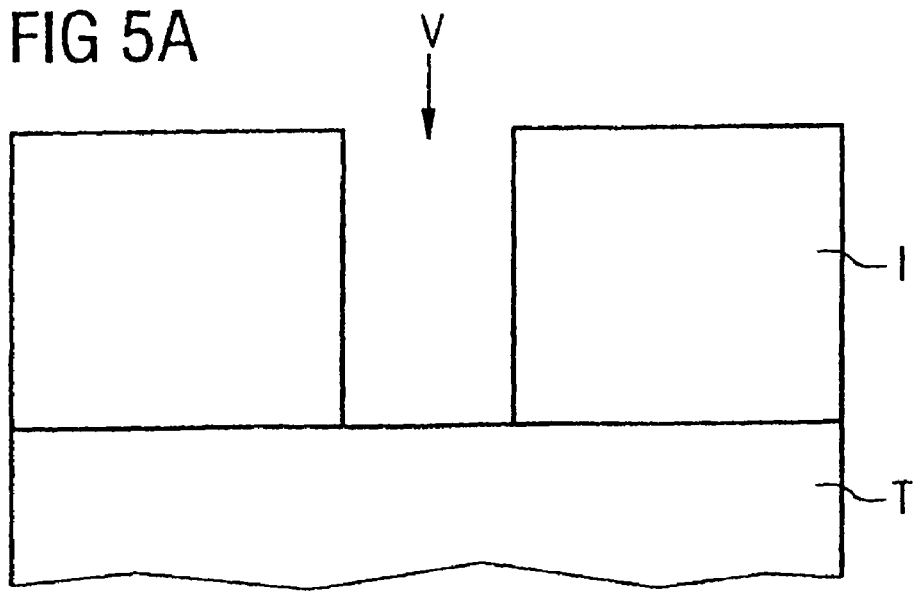

In accordance with FIG. 5A, firstly an auxiliary layer I is formed on a carrier material T and a depression V is produced in said layer. What is preferably used as carrier material T is a semiconductor substrate (Si) in which, by way of example, active regions have already been formed by means of STI methods (Shallow Trench Isolation) and doping wells and/or complete or partly finished semiconductor components already exist. Of course, other carrier materials such as SOI or silicon oxide, silicon on sapphire, etc. can also be used in addition to the preferred silicon semiconductor substrate.

As the auxiliary layer I, preferably a dielectric layer or insulator layer is deposited over the whole area on the carrier material T and provided with the depression V, but it is also possible to use alternative materials and even electrically conductive materials.

During the formation of the depression v, which constitutes for example a trench or a hole in the auxiliary layer I, by way of example, a resist layer (not illustrated) is formed and subsequently patterned by means of conventional photolithographic methods. Afterward, at least part of the auxiliary layer I is removed using the patterned resist layer (not illustrated), in which case, in accordance with FIG. 5A, the auxiliary layer I is completely removed as far as the carrier material T and, consequently, a deep trench or a deep hole is produced as the depression V. Finally, the resist layer is removed and a cleaning step (post cleaning) is possibly carried out in order to remove contaminants that have been possibly produced. Preferably, the depression is formed by carrying out anisotropic etching such as e.g. a reactive ion etch (RIE), as a result of which essentially perpendicular walls of the depression V are obtained.

Figure 5B:
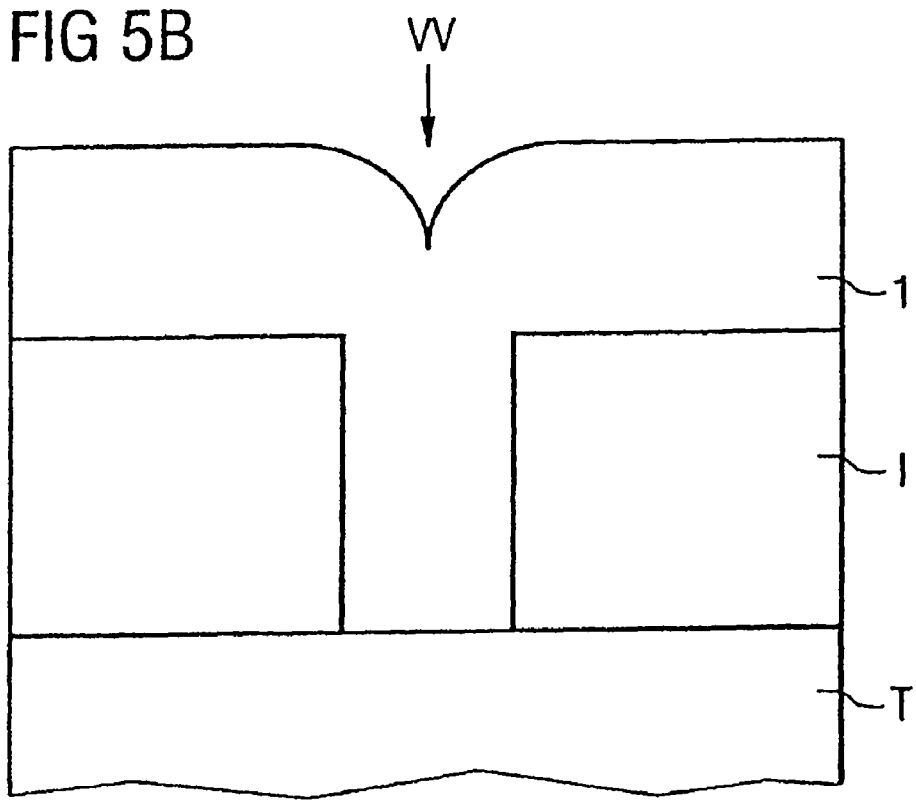

In accordance with FIG. 5B, in a subsequent step, the depression V is filled with a first electrically conductive material for forming a first electrode 1, in which case, by way of example, a chemical deposition method (CVD, Chemical Vapor Deposition) of a metal such as e.g. tungsten is carried out on the surface of the auxiliary layer I in such a way that, in the region of the depression V, an adapted depression VV is then produced in the deposited material 1.

As has already been described above, as the electrically conductive material for the first electrode 1, a material may also be selected from the abovementioned table or be formed in some other way. In accordance with FIG. 5C, in a subsequent method step, the electrically conductive material 1 is caused to recede at least as far as the surface of the auxiliary layer I conformally, i.e. to the same extent with respect to the starting surface, an anisotropic etching method, in particular, being carried out as etching-back step and the structure illustrated in FIG. 5C thus resulting for the first electrode 1. Accordingly, the adapted depression VV is taken over unchanged or transformed into the depression V.

In accordance with FIG. 5D, the auxiliary layer I is then caused to recede in such a way that the tips 4A are produced as field amplifier structure in the first electrode 1 and project sufficiently above the auxiliary layer I. The auxiliary layer is preferably etched back essentially as far as a level of the bottom region of the adapted depression VV, which results in an optimized formation of the tips or corners or edges (in the case of a trench). This process of causing the auxiliary layer I to recede is preferably once again an anisotropic etching-back step selectively with respect to the material of the first electrode 1.

Finally, in accordance with FIG. 5E, a changeover material 2 is formed on the first electrode 1 with its field amplifier structure 4A formed therein, in which case the materials or multilayer structures used in the abovementioned table can once again be used as materials. A deposition of hydrogen-saturated amorphous silicon or of a corresponding multilayer is preferably carried out in this case.

In order to complete the nonvolatile memory element SE, finally a second electrically conductive electrode 3 is formed at the surface of the changeover material 2, the materials presented in the abovementioned table once again being available, in principle. Depending on a respective application, a planarization and/or patterning of the second electrically conductive electrode 3 may subsequently be carried out.

By way of example, the second electrode 3 is formed by deposition of a metal-containing layer.

Fourth Exemplary Embodiment

Figure 6A:
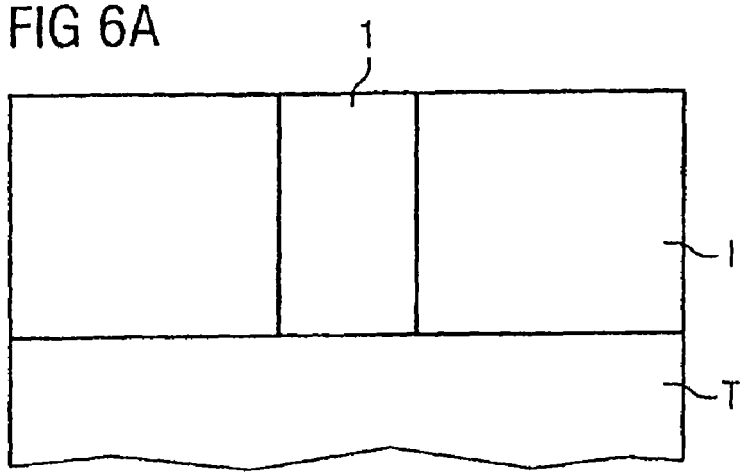
FIGS. 6A to 6C show simplified sectional views for illustrating essential method steps in the production of a nonvolatile memory element in accordance with a fourth exemplary embodiment.
Figure 6B:
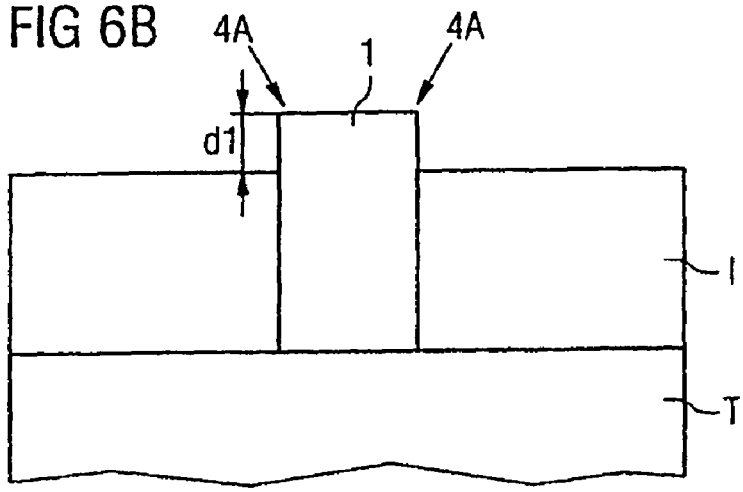
Figure 6C:
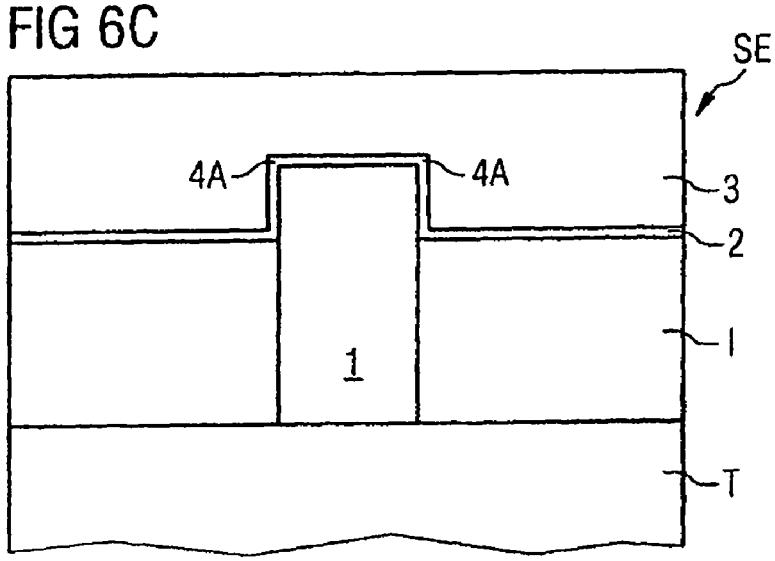

FIGS. 6A to 6C show simplified sectional views of essential method steps in the production of a nonvolatile memory element in accordance with a fourth exemplary embodiment, identical reference symbols designating layers or elements identical to those in FIGS. 1 to 4 and a repeated description being dispensed with below.

The preparatory method steps in accordance with FIGS. 5A and 5B of the third exemplary embodiment are once again carried out in accordance with this fourth exemplary embodiment, for which reason reference is expressly made to the corresponding description at this point.

In accordance with FIG. 6A, in the present fourth exemplary embodiment, after the depression V has been filled with a first electrically conductive material or forming a first electrode 1 (see FIG. 5B), firstly a planarization method is carried out in order to cause the electrically conductive material 1 to recede at least as far as the surface of the auxiliary layer I. Chemical mechanical polishing (CMP) of the tungsten layer 1 is preferably carried out, as a result of which the sectional view illustrated in FIG. 6A is obtained.

In accordance with FIG. 6B, the auxiliary layer I is subsequently caused to recede by a predetermined amount d1, a selective etching-back step, for example, being effected in order to uncover the first electrode 1 and the edges 4A formed therein as field amplifier structure.

In accordance with FIG. 6C, as in the third exemplary embodiment, once again a changeover material 2 is formed at the surface of the auxiliary layer I and the first electrode 1 and, finally, the second electrically conductive electrode 3 is formed thereon, as a result of which a nonvolatile memory element with reduced forming voltages is obtained. The field amplifier structures lie in the right-angled edges 4A of the first electrode 1 in this case. With regard to the process for forming the changeover material layer 2 and the second electrode 3, reference is expressly made to the third exemplary embodiment at this point.

Fifth Exemplary Embodiment

FIGS. 7A to 7D show simplified sectional views for illustrating essential method steps in the production of a nonvolatile memory element in accordance with a fifth exemplary embodiment, identical reference symbols designating layers or elements identical to those in FIGS. 1 to 6 and a repeated description being dispensed with below.

Figure 7A:
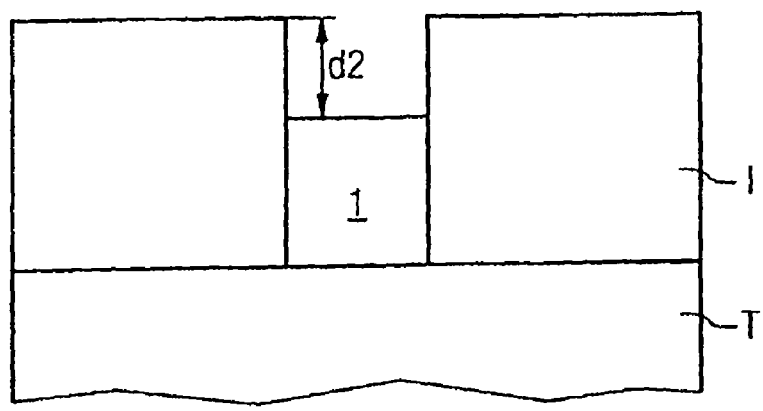

In accordance with FIG. 7A, after preparatory steps as are illustrated for example in FIGS. 5A and 5B or 6A, firstly a predetermined amount (d2) of the electrically conductive material 1 of the first electrode is removed in the depression V. In this case, use is preferably made of a conventional etching method for etching back the electrically conductive layer 1.

Figure 7B:
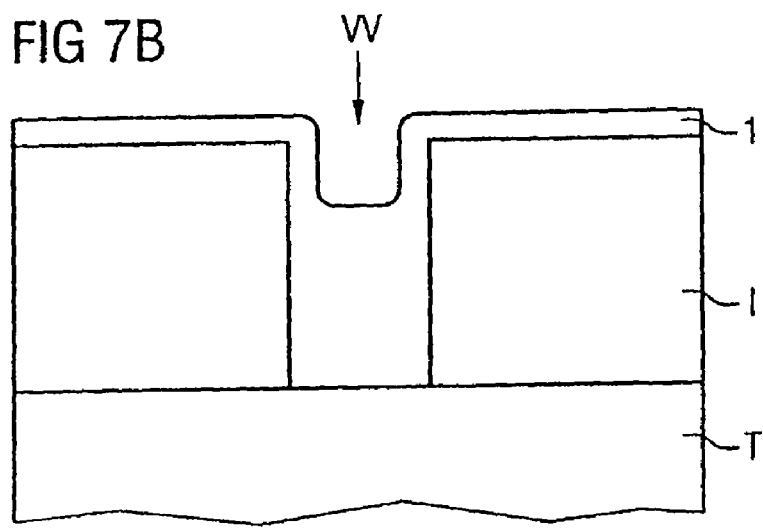

In accordance with FIG. 7B, a thin conformal electrically conductive layer is subsequently formed in such a way that an adapted depression VV remains in the region of the depression V. The layer formed conformally, i.e. with the same thickness with respect to the reference surface, is preferably composed of the same material as the first electrically conductive material 1, but other electrically conductive materials may also be applied and a multilayer structure thus results for the first electrode.

Figure 7C:
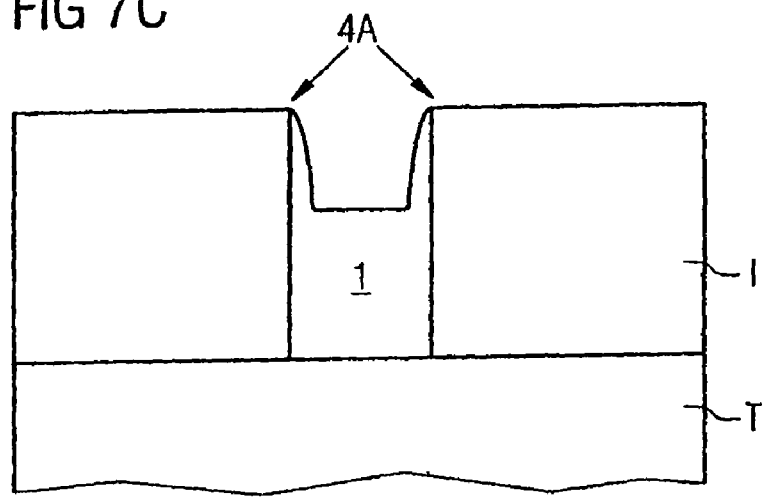

In accordance with FIG. 7C, the electrically conductive layer formed conformally or the underlying electrically conductive layer is subsequently caused to recede or etched back at least as far as the surface of the auxiliary layer I by means of an anisotropic etching method, as a result of which the tips 4A are obtained. Conventional spacer methods are preferably carried out in FIGS. 7B and 7C in order to form the tips 4A in the first electrode 1.

The method sequence described in FIGS. 6B and 6C once again takes place in accordance with FIG. 7D, in which case, by way of example, the auxiliary layer I is etched back essentially as far as the bottom region of the adapted depression W by means of an anisotropic etching method and the changeover material layer 2 and the second electrode 3 are subsequently formed. In order to avoid repetition, reference is once again made to the respective descriptions of the previous exemplary embodiments at this point.

In this way, a nonvolatile memory element SE with field amplifier structures can be made using very simple production steps, as a result of which so-called "forming voltages", in particular, can be significantly reduced.

Typical memory element arrangements which can be formed with the above-described nonvolatile memory elements for the realization of a nonvolatile memory are presented by way of example below.

Sixth Exemplary Embodiment

FIG. 8A shows a simplified equivalent circuit diagram of a memory element arrangement using a nonvolatile memory element in accordance with a sixth exemplary embodiment as is illustrated in a simplified sectional view in FIG. 8B.

In accordance with FIG. 8B, in the carrier material T, which has a semiconductor material, for example, word lines WL are formed for example by doping regions which are insulated or isolated from one another by means of shallow trench isolation STI. The further memory element construction corresponds to that of the memory element in accordance with the third exemplary embodiment, the material of the first electrode 1 being chosen in such a way that it forms a diode junction or a Schottky diode with the word line WL or the doping region.

FIG. 8A shows a memory element arrangement having a multiplicity of nonvolatile memory elements SE and associated diodes DI arranged in matrix form, which can connected via a respective diode junction or a diode DI to a respective word line formed in the semiconductor substrate T and a respective second electrode 3 being patterned in order to form a respective bit line BL in strip form at the surface of the auxiliary layer I. A memory element arrangement having an extraordinarily high integration density which can be prepared with low forming voltages is obtained in this way.

Seventh Exemplary Embodiment

Figure 9A:
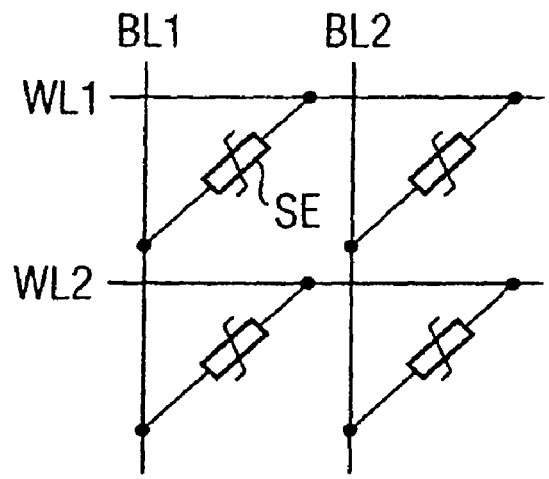
FIGS. 9A and 9B show a simplified equivalent circuit diagram of a memory element arrangement and a simplified sectional view of an associated nonvolatile memory element in accordance with a seventh exemplary embodiment.
Figure 9B:
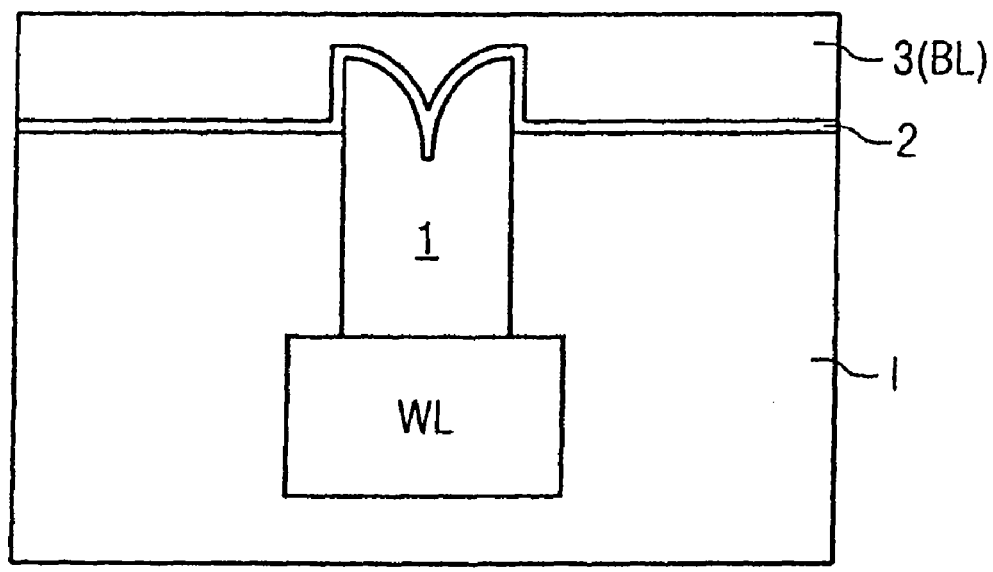

FIG. 9A shows a simplified equivalent circuit diagram of a memory element arrangement using a nonvolatile memory element in accordance with a seventh exemplary embodiment as is illustrated in a simplified sectional view in FIG. 9B, identical reference symbols designating elements identical or corresponding to those in FIG. 8 and a repeated description being dispensed with.

In accordance with FIG. 9B, a respective nonvolatile memory element comprises a first electrode 1, which is now electrically connected via an ohmic junction or a non-reactive resistor directly to a respective electrically conductive word line WL, and a respective second electrode 3, which is once again patterned in order to form the bit line BL in strip form at the surface of the auxiliary layer I.

Eighth Exemplary Embodiment

Figure 10A:
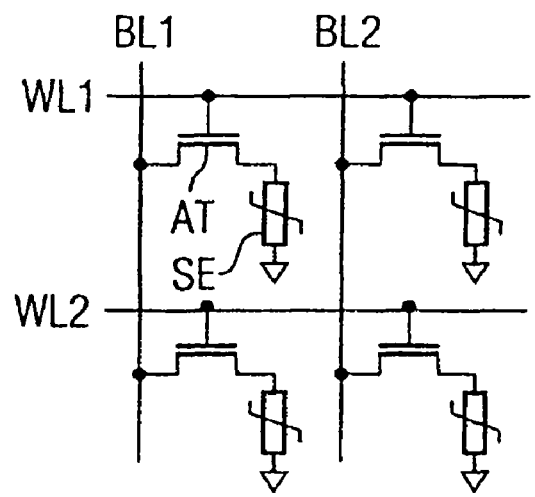
FIGS. 10A and 10B show a simplified equivalent circuit diagram of a memory element arrangement and a simplified sectional view of an associated nonvolatile memory element in accordance with an eighth exemplary embodiment.
Figure 10B:
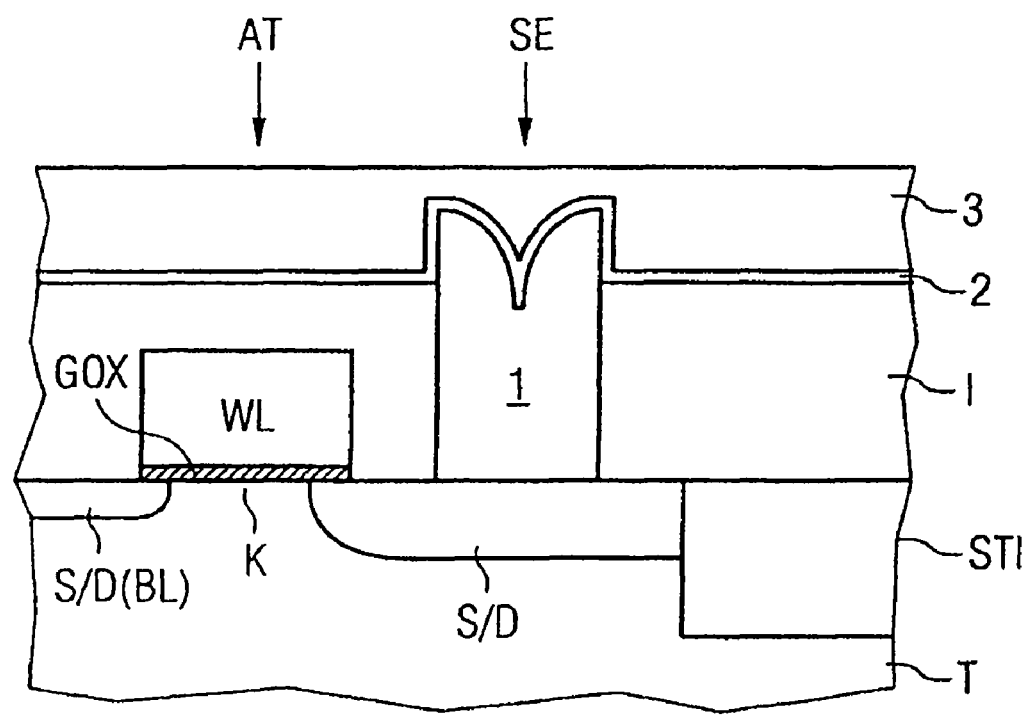

FIG. 10A shows a simplified equivalent circuit diagram for illustrating a memory element arrangement using a nonvolatile memory element in accordance with an eighth exemplary embodiment as is illustrated in a simplified sectional view in FIG. 10B, identical reference symbols designating elements identical or corresponding to those in FIGS. 8 and 9 and a repeated description being dispensed with.

In accordance with the sectional view illustrated in FIG. 10B, in the case of a memory element arrangement 30 of this type, there is formed for each nonvolatile memory element SE an associated selection transistor AT with a word line wL serving as control layer and a bit line BL serving as first source/drain region S/D in the semiconductor substrate T, a second source/drain region S/D of the selection transistor AT being connected to a respective first electrode 1 of the nonvolatile memory element SE and a respective second electrode 3 being at a common reference potential (e.g. common source). Memory element arrangements that can be realized in a particularly simple manner for a specific area of application, with minimal area requirement and significantly reduced forming voltages, once again result. As is known, a significantly improved signal-to-noise ratio is obtained if a serial selection transistor is added. This makes it possible to configure significantly larger cell arrays or sectors.

The invention has been described above on the basis of selected materials, and in particular on the basis of hydrogen-saturated amorphous silicon as changeover material. However, it is not restricted thereto and encompasses in the same way alternative materials for realizing a nonvolatile memory element with at least two different conductivity states.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A method for producing a nonvolatile memory element having the following steps:
   preparation of a carrier material;
   formation of an auxiliary layer having a top;
   formation of a depression in the auxiliary layer;
   filling of the depression substantially completely with a first electrically conductive material for forming a first electrode;
   formation of at least one field amplification structure at the first electrode, wherein in the step of formation of the at least one field amplification structure comprises:
   the first electrically conductive material is caused to recede at least as far as a surface of the auxiliary layer by planarization; and
   the auxiliary layer is etched back by a predetermined amount by selective etching;

formation of a conductivity state changeover material on the first electrode with the at least one field amplifier structure, after which at least two different conductivity states prevailing in the conductivity state changeover material, between which changeover can be repeatedly effected by the application of predetermined programming voltages; and formation of a second electrically conductive electrode on the conductivity state changeover material.

2. The method of claim 1, wherein in the step of the auxiliary layer is etched back by a predetermined amount by selective etching, the top of the auxiliary layer is etched back.

* * * * *